(12) United States Patent
Jaber et al.

(10) Patent No.: US 7,216,274 B2
(45) Date of Patent: May 8, 2007

(54) FLEXIBLE SCAN ARCHITECTURE

(75) Inventors: Talal K. Jaber, Austin, TX (US);
Srinivas Patil, Austin, TX (US); Larry E. Thatcher, Austin, TX (US);
Chih-Jen M. Lin, Austin, TX (US);
Anil K. Sabbavarapu, Austin, TX (US); David M. Wu, Austin, TX (US);
Madhukar K. Reddy, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 10/609,254

(22) Filed: Jun. 26, 2003

(65) Prior Publication Data
US 2004/0267504 A1 Dec. 30, 2004

(51) Int. Cl.
*G01R 31/28* (2006.01)

(52) U.S. Cl. ................................................. 714/726
(58) Field of Classification Search ................ 714/726, 714/727, 728, 729, 730, 732, 724, 733, 30
See application file for complete search history.

(56) References Cited

U.S. PATENT DOCUMENTS 5,627,841 A * 5/1997 Nakamura ................... 714/731
6,028,983 A * 2/2000 Jaber ............................ 714/30

* cited by examiner

*Primary Examiner*—James C Kerveros
(74) *Attorney, Agent, or Firm*—Caven & Aghevli LLC

(57) ABSTRACT

A testing architecture for testing a complex integrated circuit in which each functional unit may be tested independently of the others. Embodiments of the invention allow testing of functional units to take place at slower or faster clock speeds than other portions of the processor without incurring delay or other adverse timing effects.

38 Claims, 9 Drawing Sheets

FLEXIBLE SCAN ARCHITECTURE

FIELD

Embodiments of the invention relate to microprocessor testing architecture. More particularly, embodiments of the invention relate to a flexible scan architecture that enables isolation of various portions of a microprocessor for testing purposes independently of their functional mode.

BACKGROUND

As microprocessor architecture complexity and gate-count increases, so does the complexity and necessity of having adequate test coverage of each functional unit. Furthermore, increases in test coverage typically brings increased test time, power, and other effects that can increase the cost of testing.

Prior art testing architectures typically group functional units into testing groups, such as clusters and sub-cluster units, such that they are tested at once, thereby decreasing the amount of die real estate necessary to accommodate the testing circuitry. This technique, however, is often at the expense of comprehensive test coverage, as the functional units within the testing groups cannot be isolated and independently tested.

Prior art testing architectures also typically control the testing architecture logic with the same clock (or some derivative thereof) as the functional or system clock of the processor, thereby introducing delay and other timing problems into the testing of the processor, reducing the overall test time.

Finally, some prior art techniques typically separate various hierarchical testing groups in the testing architecture using logic that precludes one set of functional units from being tested with an automatic test pattern while another set of functional units are being operated under normal processor operating conditions. Such a testing architecture can be limiting in that it forces one to make trade-offs between test coverage, test time, and power concerns.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

Embodiments of the invention relate to microprocessor testing architecture. More particularly, embodiments of the invention relate to a flexible scan architecture that enables isolation of various portions of a microprocessor for testing purposes independently of their functional mode.

Embodiments of the invention described herein enable the isolation and independent testing of functional units throughout a processor architecture by using a scan clock chain architecture that is separate and independent of the processor's functional, or system, clock chain structure. Furthermore, embodiments of the invention allow testing of functional units to take place at slower or faster clock speeds than other portions of the processor without incurring delay or other adverse timing effects.

Figure 1:
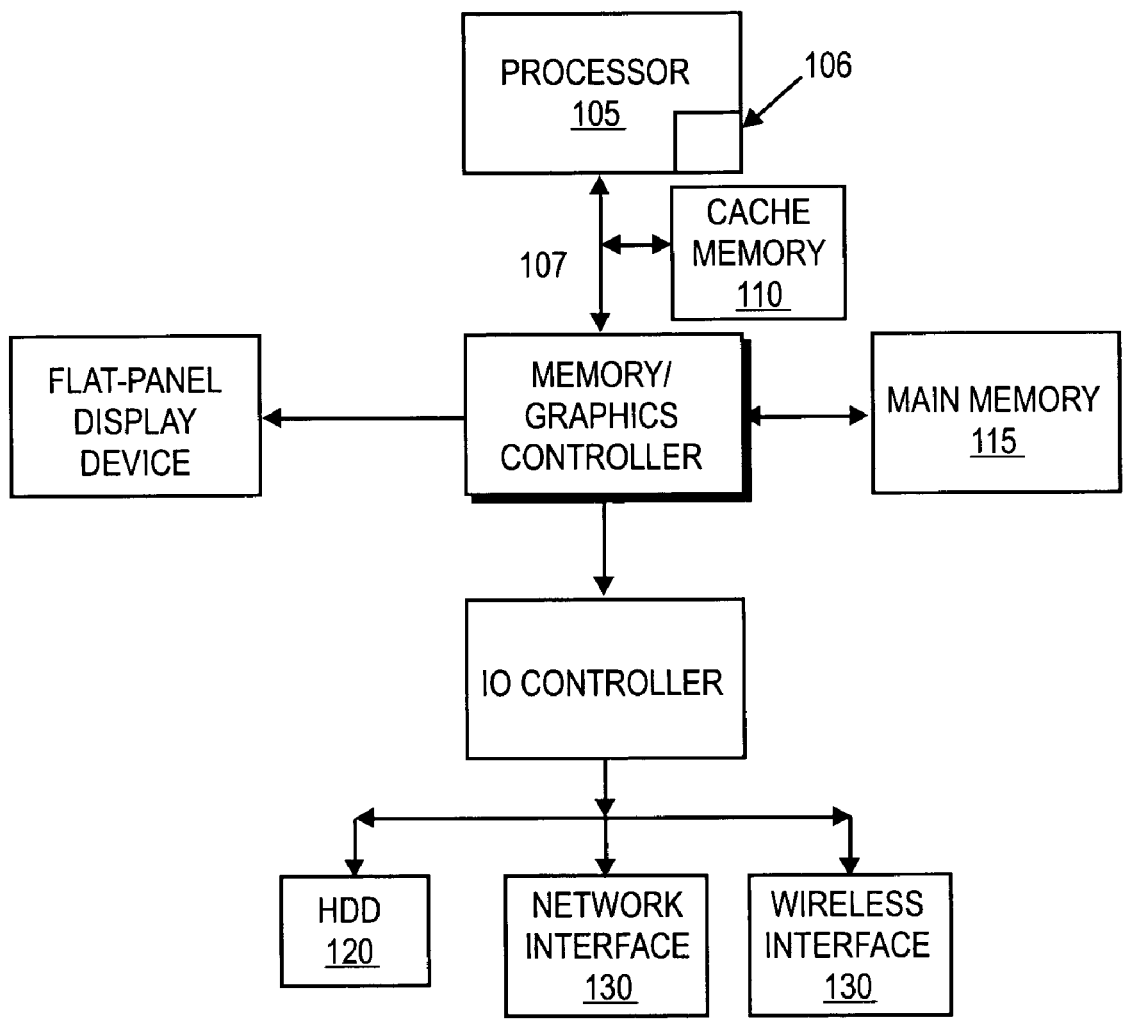
FIG. 1 illustrates computer system in which a processor may be used containing at least one embodiment of the invention.

FIG. 1 illustrates a computer system in which at least a portion of one embodiment of the invention may be performed. A processor 105 accesses data from a cache memory 110 and main memory 115, which comprises a memory system.

Illustrated throughout the processor of FIG. 1 is logic 106 for controlling a test scan architecture according to one embodiment of the invention. The particular configuration of the test architecture logic illustrated in FIG. 1 may be different in other embodiments. Furthermore, embodiments of the invention may be implemented within other devices within the system, such as a separate bus agent, or distributed throughout the system in hardware, software, or some combination thereof.

The computer system's main memory is interfaced through a memory/graphics controller 112. Furthermore, the main memory may be implemented in various memory sources, such as dynamic random-access memory ("DRAM"). Other memory sources may also be used as the system's main memory and accessed through an input/output controller 117. These memory sources include a hard disk drive ("HDD") 120, or a memory source 130 located remotely from the computer system containing various storage devices and technologies. The cache memory may be located either within the processor or in close proximity to the processor, such as on the processor's local bus 107. The system may include other peripheral devices, including a display device 111, which may interface to a number of displays, such as flat-panel, television, and cathode-ray tube.

Embodiments of the invention may be performed using logic consisting of standard complementary metal-oxide-semiconductor (CMOS) devices (hardware) or by using logic that is programmed by instructions (software) stored upon a machine-readable medium, which when executed by a machine, such as a processor, cause the machine to perform a method to carry out the steps of an embodiment of the invention. Alternatively, a combination of hardware and software may be used to carry out embodiments of the invention.

Figure 2:
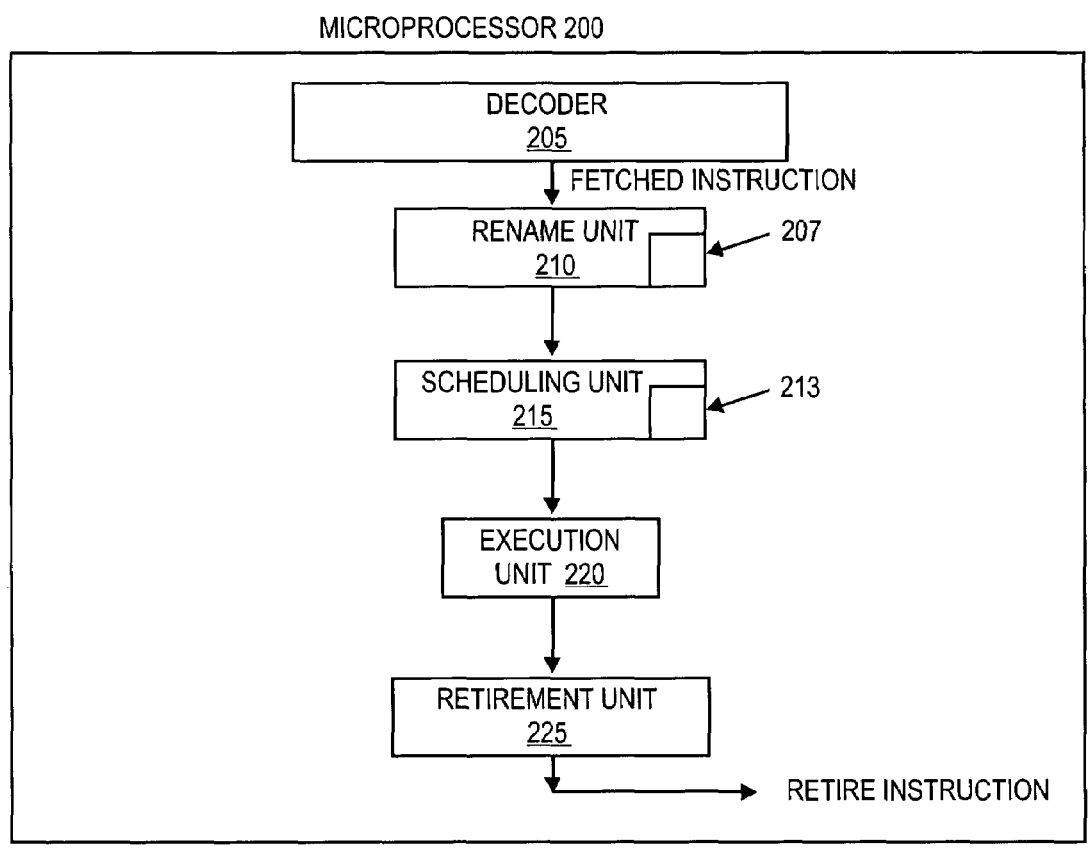
FIG. 2 illustrates a processor architecture in which at least one embodiment of the invention may be used.

FIG. 2 illustrates a portion of a microprocessor architecture in which at least one embodiment of the invention may be used. The processor of FIG. 2 contains a number of logical clusters 205, 210, 215, 220, 225. A cluster is typically a functional unit that performs a specific function, such as floating-point execution. Each cluster may contain smaller functional units, such as functional blocks (FUBs), that control or serve various functions within a cluster. In at least one embodiment of the invention a scan control architecture, including various control units 207, 213 within the clusters or other functional units, enable the isolation and testing of one or more these smaller functional units independently of other clusters or functional units that may be idle or operating in normal functional mode. Furthermore, each of the clusters of FIG. 2 and the smaller functional units therein, may be tested at slower speeds than other portions of the processor without incurring delay or other adverse timing effects, such as race conditions, etc.

Figure 3:
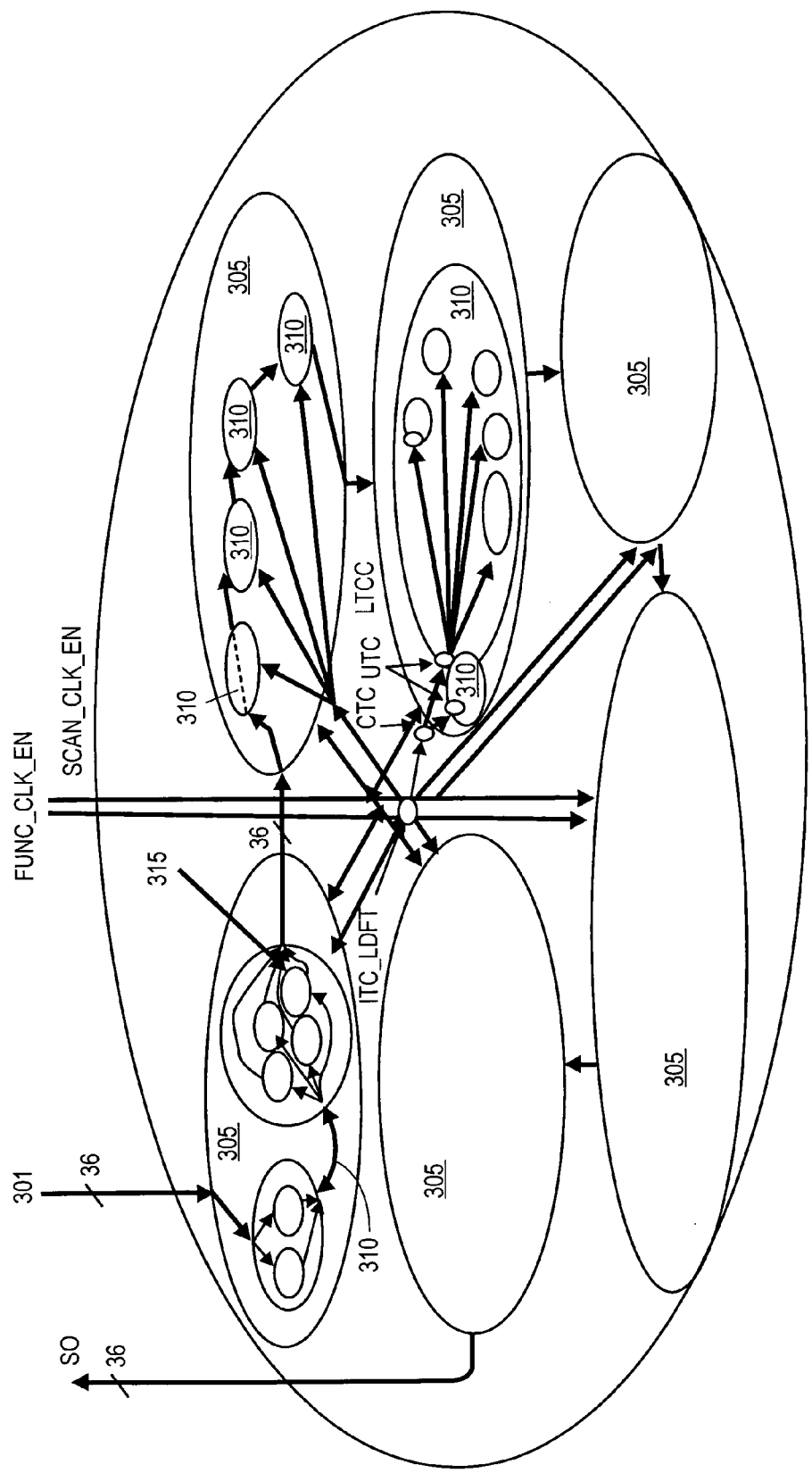
FIG. 3 illustrates a test scan model according to one embodiment of the invention.

FIG. 3 illustrates a test scan model according to one embodiment of the invention. The test scan model illustrated in FIG. 3 takes advantage of the logical architectural hierarchy of the processor by associating scan control blocks with every level of the processor's architectural hierarchy. This scan architecture allows for support of a partitioned-based automatic test pattern generator (ATPG) for testing the processor in partitions, such as clusters and FUBs.

Particularly, the test scan model of FIG. 3 contains 36 scan inputs 301 that may control 6 different clusters 305. Within a cluster, the 36 scan chains are distributed across logical units 310. Within a unit, the 36 scan chains are divided among the various FUBs 315. More or fewer scan chains may be used in other embodiments, depending upon the architecture of the integrated circuit to be tested. In the test scan model of FIG. 1, any cluster or other functional unit can be included in an ATPG partition by encoding the respective scan clock chain(s) in the appropriate scan chain group responsible for controlling the particular functional unit(s). Similarly, any cluster or other functional unit can be included in a functional group by enabling the respective functional clock chain(s) independently of the scan clock chain(s).

Figure 4:
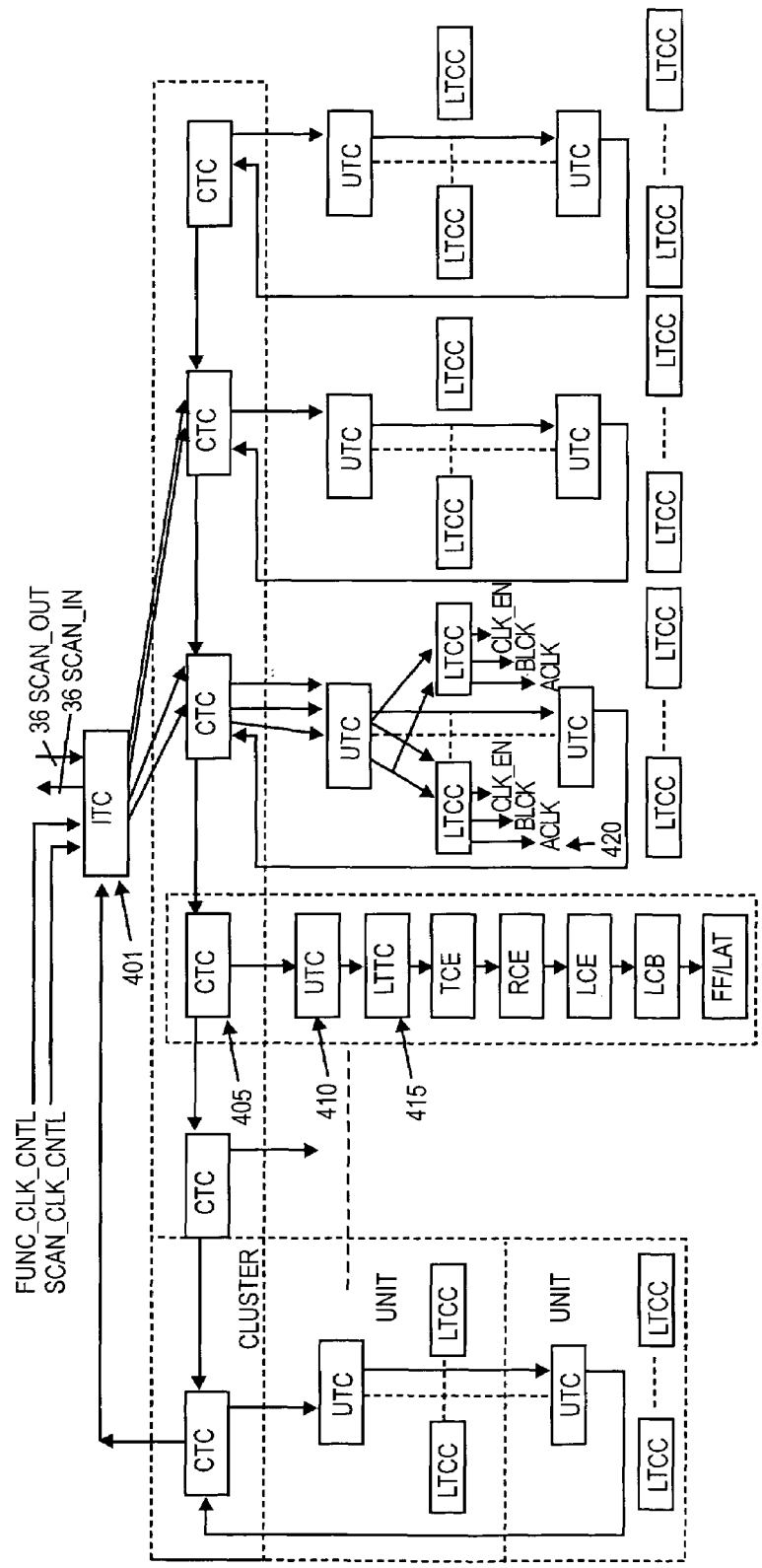
FIG. 4 illustrates control blocks for a test scan architecture according to one embodiment of the invention.

FIG. 4 illustrates a control block hierarchy for a test scan architecture according to one embodiment of the invention. At the top of the hierarchy, the required block is the integrated test controller (ITC) block 401. The ITC block routes the 36 scan chains for this particular scan architecture from the processor input/output pins to a cluster in the scan chain configuration. The ITC also generates independently controlled scan clocks and functional (system) clocks for every cluster on the chip. Independent control of the cluster scan clocks and system clocks is achieved in one embodiment of the invention by configuring control registers in the ITC logic.

At the next level of the logical hierarchy (cluster level) is a cluster test controller (CTC) block 405. The CTC block contains logic to encode the cluster scan chains in a targeted ATPG partition or exclude the cluster scan chains by-passing the cluster logic altogether. The CTC also provides control of the scan clocks and functional (system) clocks for its respective cluster. This control of the scan and system clocks as well as control of the scan chain configuration is achieved in one embodiment of the invention by programming control registers in the CTC logic.

At the next lower level of the logical hierarchy (unit level) is the unit test controller (UTC) block 410. The UTC block has logic to encode the unit scan chains in the targeted ATPG partition or exclude the unit scan chains by-passing the unit logic altogether. The UTC block also provides control of the scan clocks and functional (system) clocks for its respective unit. This control of the scan and system clocks as well as control of the scan chain configuration is achieved in one embodiment of the invention by programming control registers in the UTC logic. Because the CTC and UTC blocks perform similar functions, their control logic can be similar and in some case used interchangeably.

At the next lower level of the logical hierarchy (FUB level) is the local test clock controller (LTCC) block 415. The LTCC block provides control of the scan clocks and functional (system) clocks for a particular FUB. This control of the scan and system clocks is achieved in one embodiment of the invention by programming control registers in the LTCC logic.

In addition to control of the scan clock, the LTCC controls the A and B clock signal 420 generation logic. The A clock is a master scan clock of an associated master-slave flip-flop and the B clock is the slave scan clock. The A and B clocks are generated to control a particular FUB independently of the scan and functional clocks, so that each FUB may be tested in isolation. This means that each FUB may be tested at a slower speed than other portions of the processor. Because the A and B clocks are independent of the scan and functional clocks, they do not incur delay or other adverse effects, such as race conditions.

Figure 5:
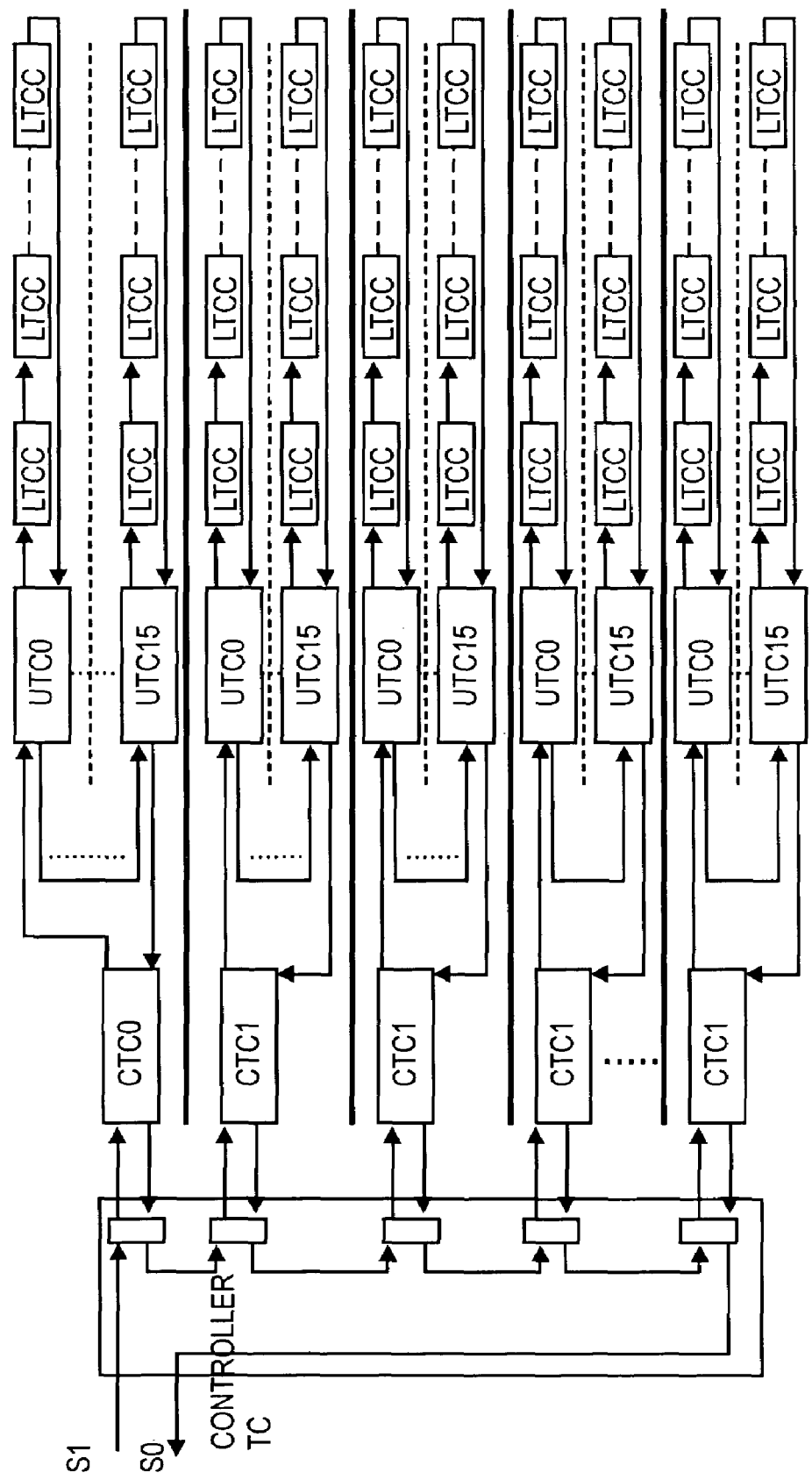
FIG. 5 illustrates a scan chain architecture used in a test scan architecture according to one embodiment of the invention.

FIG. 5 illustrates a scan chain architecture used in a test scan chain architecture according to one embodiment of the invention. A test scan chain 501 couples together all of the control registers residing in all of the test scan control blocks—namely, the ITC, CTC, UTC and LTCC blocks. The scan chain can be independently controlled by the tester via its own scan clock and is normally programmed (initialized) before partitioned ATPG processing can start. By programming the scan chain, the user decides which scan chain configuration is created and which scan clock or functional (system) clocks are enabled for a particular ATPG partition. Once the scan chain is set to a particular value, it can remain in that state for the duration of the ATPG process. Test scan chain definition can be done in the design phase of the processor or other device or by enabling fuses in the design after the device is produced.

Figure 6:
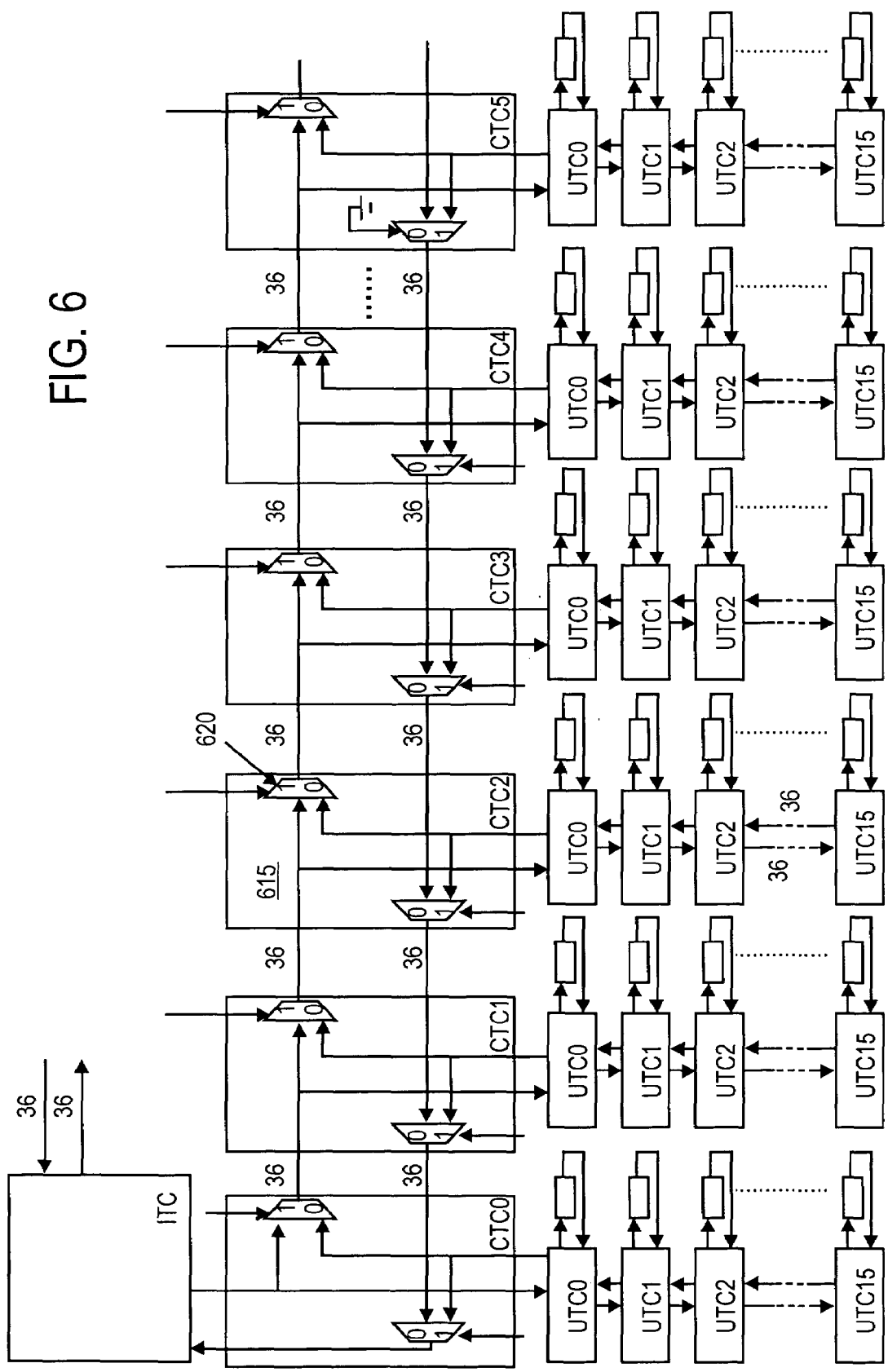
FIG. 6 illustrates a scan chain configuration for supporting a partitioned-based automatic test pattern generator according to one embodiment of the invention.

FIG. 6 illustrates a scan chain configuration for supporting a partitioned-based automatic test pattern generator according to one embodiment of the invention. In FIG. 6, the ATPG partition is to include unit 0 605 and unit 2 610 of cluster 2 615 only. The control registers within CTC0 and CTC1 controlling the scan chain routing logic are programmed such that all scan chains in cluster 0 and cluster 1 are bypassed. In the embodiment of FIG. 6, this can be achieved by setting the control register to a 1 value for the upper multiplexer (MUX) 620 in both CTCs, as well as to those of UTC1 and UTC3 through UTC15 of cluster 2. The lower MUX 625 of CTC2 is programmed such that the input from UTC0 is selected, thereby excluding all of the downstream clusters from the ATPG partition.

Figure 7:
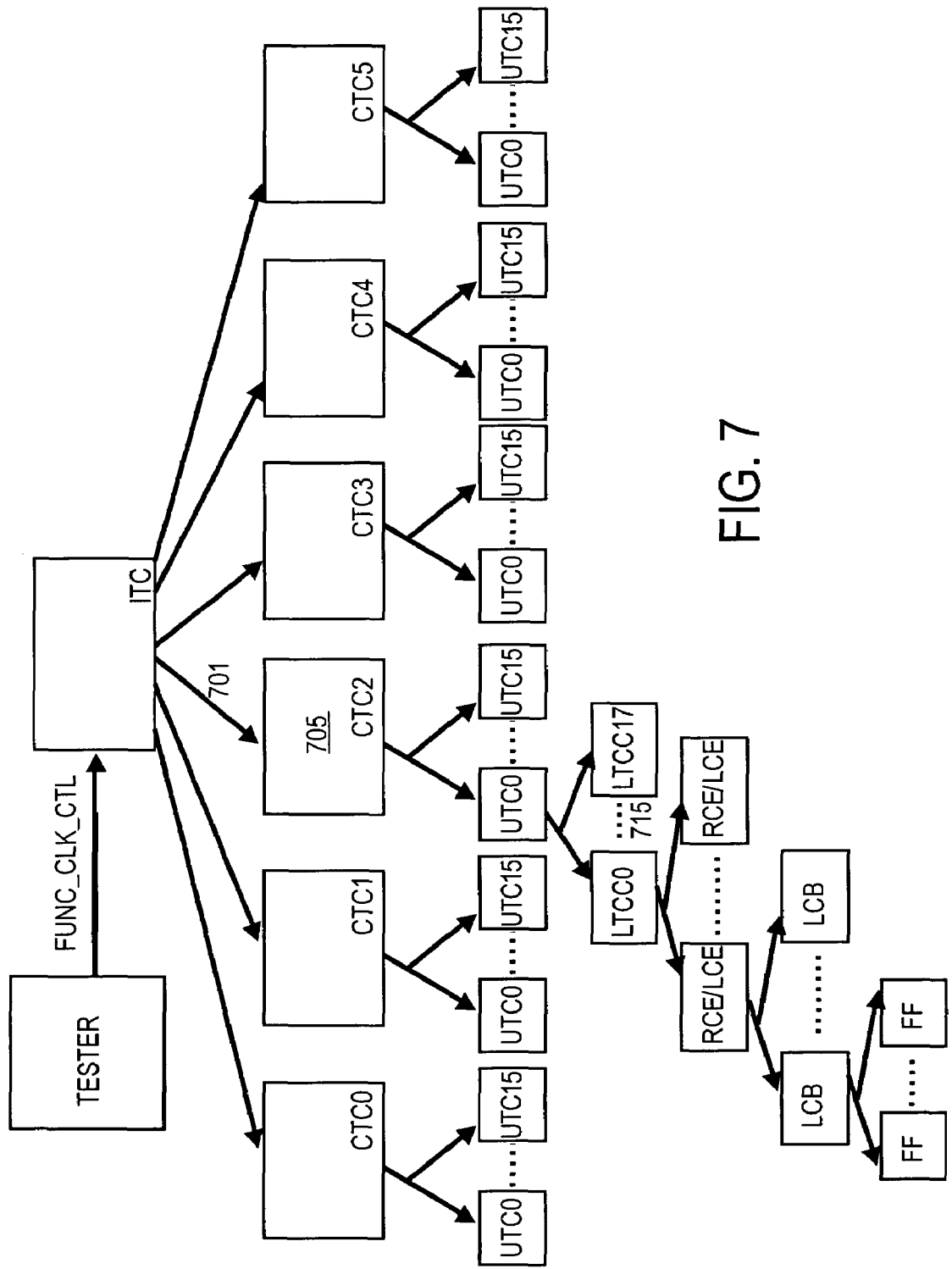
FIG. 7 illustrates a functional control architecture for supporting a partitioned-based automatic test pattern generator according to one embodiment of the invention.

FIG. 7 illustrates a functional control architecture for supporting a partitioned-based automatic test pattern generator according to one embodiment of the invention. This is accomplished in the embodiment illustrated in FIG. 7 by programming control registers in the test scan control block or blocks 705, 710, 715 that form a particular ATPG partition 701. Functional clocks corresponding to non-selected ATPG partitions may be disabled to manage power and parasitic capacitance during testing. The clock enable blocks (LCB, LCE, RCE) illustrated in FIG. 7 are not part of the test scan architecture. Nevertheless, they may serve as staging logic for the ATPG functional clock enable signal in at least one embodiment of the invention.

Figure 8:
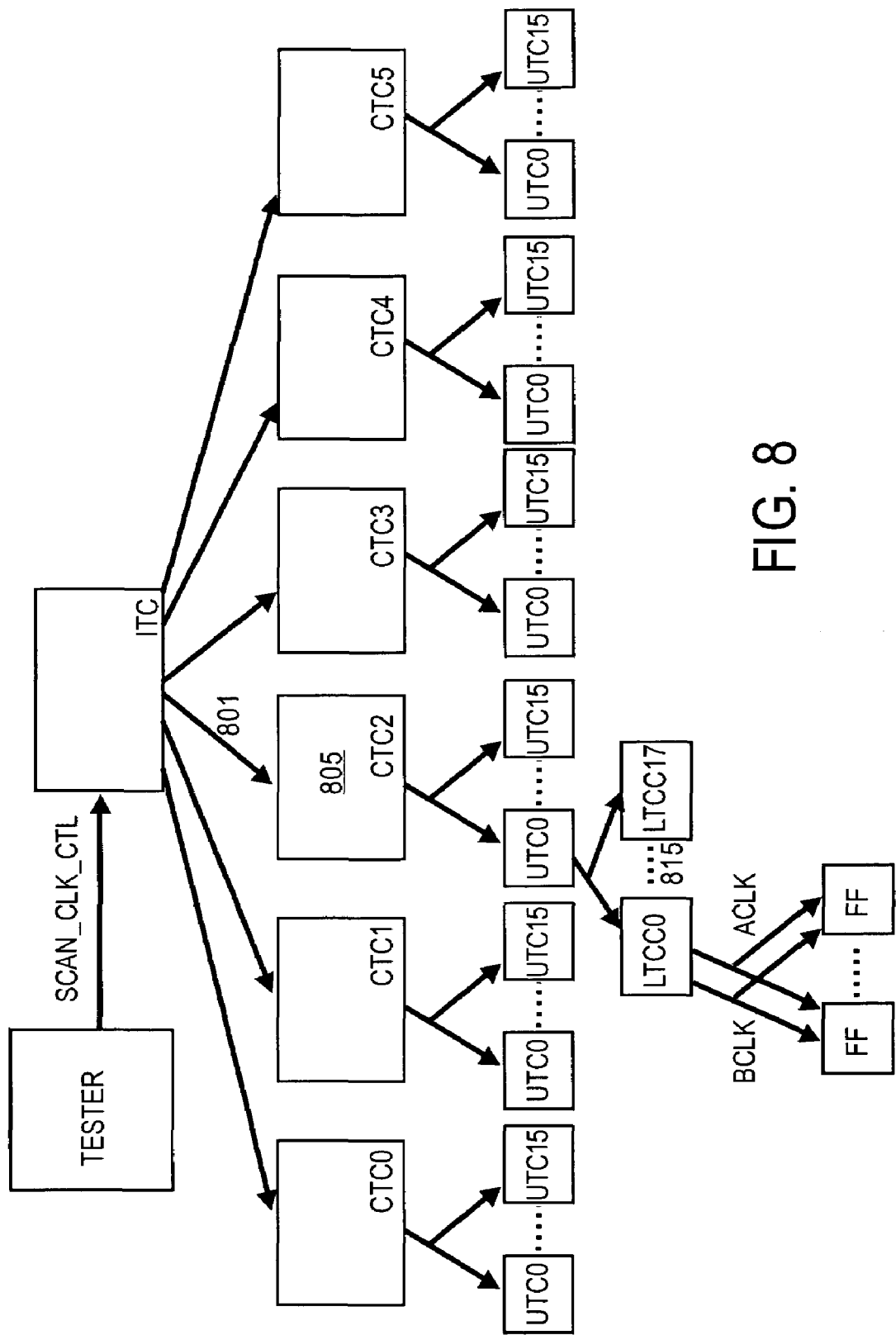
FIG. 8 illustrates a scan clock control architecture for supporting a partitioned-based automatic test pattern generator according to one embodiment of the invention.

FIG. 8 illustrates a scan clock control architecture for supporting a partitioned-based automatic test pattern generator according to one embodiment of the invention. In a similar fashion to the control of the functional clock, control of the scan clock is achieved at every level of the logical hierarchy. This is accomplished by programming control registers in the test-scan control block or blocks 805, 810, 815 that form an ATPG partition 801. Scan clocks that belong to non-selected ATPG partitions may be disabled to manage power and parasitic capacitance during testing.

If the scan clock control register within a CTC is disabled, however, all of the units within that cluster have their functional clocks disabled regardless of the values of the UTC functional clock control registers for that particular cluster. In order for a unit of a cluster to be included in an ATPG partition, the CTC functional clock control register for that cluster and the UTC functional clock control register for that unit should both be enabled in the embodiment illustrated in FIG. 8.

Likewise, if the functional clock control register within a CTC block is disabled, all functional clocks of the units within that cluster are disabled regardless of the values of the UTC functional clock control registers for that particular cluster. In order for a unit of a cluster to be included in an ATPG partition, the CTC functional clock control register for that cluster, and the UTC functional clock control register for that unit should both be enabled in the embodiment illustrated in FIG. 8.

Figure 9:
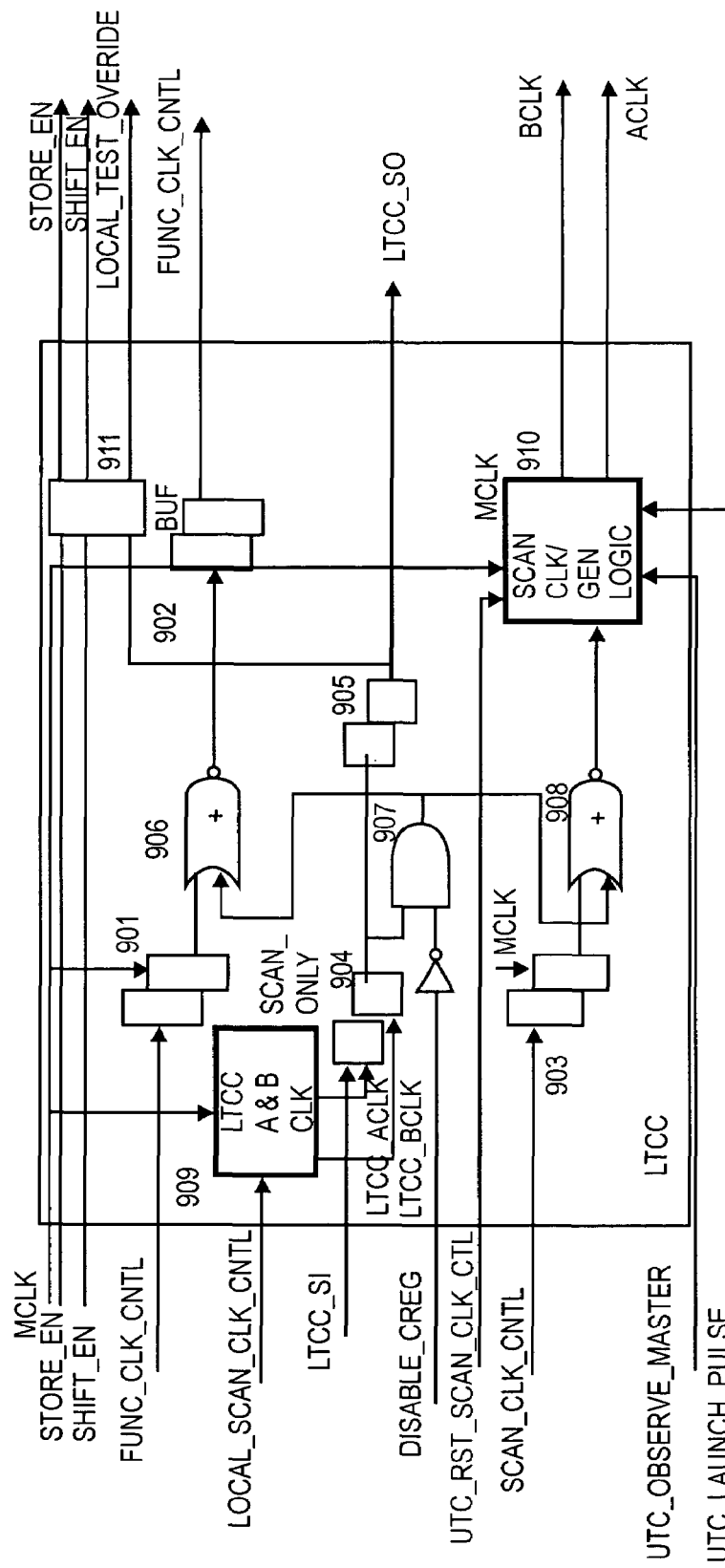
FIG. 9 illustrates a local test control circuit used in conjunction with at least one embodiment of the invention.

FIG. 9 illustrates a local test control circuit used in conjunction with at least one embodiment of the invention. The UTC and CTC control blocks are similar to the LTCC block, but the UTC and CTC blocks include an additional MUX to support scan chain configuration. The ITC logic is also similar to the CTC and UTC. The ITC block, however, includes logic for control and programming of the functional clocks in ATPG mode.

Blocks 901, 902 and 903 are flip-flops used to pipeline and stage the functional clock and scan clock control signals, respectively. Block 904 is a control register to enable or disable the functional clock and scan clock control signals. This control register can be overridden by a primary input control signal (DISABLE_CREG). This override function is achieved by logic within blocks 907, 906 and 908. Block 905 is a control register that can be programmed to override some of the functional logic at the FUB level during ATPG processing. Blocks 904 and 905 are coupled together as part of the test scan chain configured by control registers in the test-scan controllers. Block 910 generates the A and B clocks from the slow SCAN-CLK-CNTL signal.

Block 909 generates the LTCC control registers (blocks 904 and 905) scan clocks. The A and B clocks are derived from an independent Local-SCAN-CLK-CNTL signal that is used to initialize the test scan chain. Block 911 is a buffer to store the output of control register 905. All of the LTCC cells are clocked with the free running system clock (MCLK).

Embodiment of the invention support system debug by allowing the configuration of the scan controllers to address a particular portion on the chip. If the logic of a portion contains non-destructive scan cells, or if shadow listening scan cells are used, etc., a "snapshot" of the state of the tested portion can be taken for debug purposed while the processor is running by controlling the scan and functional clocks through the ITC block.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. An apparatus comprising:
   first control means for routing a functional clock to a functional unit within an integrated circuit;
   second control means for routing a scan clock to the functional unit,
   the second control means being independent of the first control means, wherein the first and second control means enables testing of the functional unit while other functional units not being tested operate using the functional clock.

2. The apparatus of claim 1 wherein the second control means comprises a cluster test controller, a unit test controller, and a local test clock controller coupled to each other in a logical hierarchy to control the functional unit independently of any other functional unit.

3. The apparatus of claim 2 wherein the functional unit comprises a plurality of (FUBs).

4. The apparatus of claim 3 further comprising a third clock means for at least partially controlling the plurality of functional blocks (FUBs) independently of the functional clock.

5. The apparatus of claim 4 wherein the third clock means comprises a master clock generation circuit and a slave clock generation circuit.

6. The apparatus of claim 5 wherein the first control means is a hierarchy of functional clocks to control the functional unit during normal operation.

7. The apparatus of claim 6 wherein the second control means is a hierarchy of functional clocks to control the functional unit during testing.

8. A processor comprising:
   a functional clock hierarchy to operate a plurality of functional units within the processor at a first set of clock speeds;
   a scan clock hierarchy to operate the plurality of functional units within the processor at a second set of clock speeds independently of the functional clock hierarchy, the second set of clock speeds being slower than the first set of clock speeds.

9. The processor of claim 8 wherein the scan clock hierarchy comprises integrated test control (ITC) logic, cluster test control (CTC) logic, unit test control (UTC) logic, and local test clock control (LTCC) logic coupled to each other in a logical hierarchy in order to help operate the plurality of functional units independently of other functional units.

10. The processor of claim 9 wherein the ITC logic, CTC logic, the UTC logic, and the LTCC logic comprise registers to control the routing of a functional clock and a scan clock from the pins of the processor to the plurality of functional units.

11. The processor of claim 10 wherein the ITC logic controls the routing of the functional clock independently of the routing of the scan clock to the CTC logic.

12. The processor of claim 11 wherein the CTC logic controls the routing of the functional clock independently of the routing of the scan clock to the UTC logic.

13. The processor of claim 12 wherein the UTC logic controls the routing of the functional clock independently of the routing of the scan clock to the LTCC logic.

14. The processor of claim 13 wherein the LTCC logic controls a master and slave clock that operate independently of the scan clock and functional clock.

15. The processor of claim 14 wherein the master and slave clocks control testing of a functional blocks (FUBs).

16. The processor claim 15 wherein the registers enable a first set of functional units to operate at the functional clock speed concurrently with a second set of functional units operating at the scan clock speed without the first or second set of functional units experiencing delay caused by the operation of the other.

17. The processor of claim 16 wherein the scan clock hierarchy is to be used during testing of the processor.

18. A system comprising:
a memory unit;
a processor coupled to the memory unit, the processor comprising a scan control chain and a functional control chain to route a scan control clock and a functional control clock, respectively, to a plurality of functional units and operate a first set of the plurality of functional units independently and concurrently with a second set of the plurality of functional units.

19. The system of claim 18 wherein the scan control clock is able to control the plurality of functional units without experiencing delay caused by the functional control clock and visa versa.

20. The system of claim 19 wherein the scan clock chain is to pass data relating to an automatic test pattern between an automatic test pattern generator and one of the first and second set of functional units.

21. The system of claim 20 wherein the processor comprises a scan clock enable signal to enable the scan clock chain independently of the functional clock chain.

22. The system of claim 21 wherein the processor comprises a plurality of inputs to receive scan data generated from the automatic test pattern generator.

23. The system of claim 22 wherein the processor comprises a plurality of outputs to deliver scan data to testing apparatus.

24. The system of claim 23 wherein the number of the plurality of inputs and the number of the plurality of outputs is 36.

25. The system of claim 24 wherein the scan clock is able to operate at a slower speed than the functional clock without either incurring a delay due to the other.

26. An apparatus comprising:
a functional clock chain to operate a plurality of functional units within the processor at a first set of clock speeds;
a scan clock chain to operate the plurality of functional units within the processor at a second set of clock speeds independently of the functional clock chain, the second set of clock speeds being slower than the first set of clock speeds;
an integrated test control (ITC) logic, cluster test control (CTC) logic, unit test control (UTC) logic, and local test clock control (LTCC) logic coupled to each other in a logical hierarchy in order to help operate the plurality of functional units independently of other functional units, wherein the ITC logic, CTC logic, the UTC logic, and the LTCC logic comprise registers to control the routing of a functional clock and a scan clock from the pins of the processor to the plurality of functional units.

27. The apparatus of claim 26 wherein the ITC logic controls the routing of the functional clock independently of the routing of the scan clock to the CTC logic.

28. The apparatus of claim 27 wherein the CTC logic controls the routing of the functional clock independently of the routing of the scan clock to the UTC logic.

29. The apparatus of claim 28 wherein the UTC logic controls the routing of the functional clock independently of the routing of the scan clock to the LTCC logic.

30. The apparatus of claim 29 wherein the LTCC logic controls a master and slave clock that operate independently of the scan clock and functional clock.

31. The apparatus of claim 30, wherein the master and slave clocks control testing of a (FUBs).

32. A processor comprising:
a first clock circuit to clock a first functional unit while the first functional unit is not being tested;
a second clock circuit to clock a second functional unit independently of the first clock circuit while the second functional unit is being tested.

33. The processor of claim 32 wherein the second clock circuit comprises a cluster test controller, a unit test controller, and a local test clock controller.

34. The processor of claim 33 wherein the functional unit comprises a plurality of functional units.

35. The processor of claim 34 further comprising a third clock circuit to at least partially control the plurality of functional units independently of the functional clock circuit.

36. The processor of claim 35 wherein the third clock circuit comprises a master clock generation unit and a slave clock generation unit.

37. The processor of claim 36 wherein the first clock circuit is to couple a functional clock signal to the first and second functional units during normal operation of the first and second functional units.

38. The processor of claim 37 wherein the second clock circuit is to couple a functional clock signal to the first and second functional units during testing of the first and second functional units.

* * * * *

UNITED STATES PATENT AND TRADEMARK OFFICE
CERTIFICATE OF CORRECTION

PATENT NO. : 7,216,274 B2  Page 1 of 1
APPLICATION NO. : 10/609254
DATED : May 8, 2007
INVENTOR(S) : Jaber et al.

It is certified that error appears in the above-identified patent and that said Letters Patent is hereby corrected as shown below:

In column 6, line 18, in Claim 3, before "(FUBs)." insert -- functional blocks --.

In column 6, line 67, in Claim 15, delete "blocks (FUBs)." and insert -- block (FUB). --, therefor.

In column 8, line 22, in Claim 31, delete "(FUBs)" and insert
-- functional block (FUB) --, therefor.

Signed and Sealed this

Sixth Day of May, 2008

JON W. DUDAS
*Director of the United States Patent and Trademark Office*